(12) United States Patent
Yeric (10) Patent No.: US 8,812,997 B2
(45) Date of Patent: Aug. 19, 2014

(54) STRUCTURAL FEATURE FORMATION WITHIN AN INTEGRATED CIRCUIT

(75) Inventor: Gregory Munson Yeric, Austin, TX (US)

(73) Assignee: ARM Limited, Cambridge (GB)

( * ) Notice: Subject to any disclaimer, the term of this patent is extended or adjusted under 35 U.S.C. 154(b) by 294 days.

(21) Appl. No.: 13/067,240

(22) Filed: May 18, 2011

(65) Prior Publication Data
US 2011/0225555 A1    Sep. 15, 2011

Related U.S. Application Data

(63) Continuation of application No. 12/379,122, filed on Feb. 12, 2009, now abandoned.

(51) Int. Cl.
*G06F 17/50*    (2006.01)

(52) U.S. Cl.
USPC .................................. 716/55; 716/50; 716/54

(58) Field of Classification Search
USPC ................................................ 716/50, 54, 55
See application file for complete search history.

(56) References Cited

U.S. PATENT DOCUMENTS

| | | | |
|---|---|---|---|
| 6,732,334 B2 * | 5/2004 | Nakatsuka | ....................... 716/50 |
| 6,833,595 B1 | 12/2004 | Iwasaki | |
| 7,233,052 B2 | 6/2007 | Tamaoka et al. | |
| 7,701,034 B2 | 4/2010 | Chuang et al. | |
| 2002/0061614 A1 | 5/2002 | Kling et al. | |
| 2003/0104286 A1 | 6/2003 | Lin et al. | |
| 2009/0273100 A1 | 11/2009 | Aton et al. | |

FOREIGN PATENT DOCUMENTS

| | | |
|---|---|---|
| JP | 63-058825 | 3/1988 |
| JP | 2000-223663 | 8/2000 |
| JP | 2001-7109 | 1/2001 |
| JP | 2006-156778 | 6/2006 |
| JP | 2009-025450 | 2/2009 |

OTHER PUBLICATIONS

Chinese First Office Action issued Oct. 10, 2013 in CN 201010121925.3 and English translation.
Japanese Office Action issued Nov. 19, 2013 in JP 2010-027841 and English translation.
Chinese Office Action issued Jun. 20, 2014 in CN 201010121925.3.

* cited by examiner

*Primary Examiner* — Jack Chiang
*Assistant Examiner* — Magid Dimyan
(74) *Attorney, Agent, or Firm* — Nixon & Vanderhye P.C.

(57) ABSTRACT

An integrated circuit is formed using an lithographic process including a stage of forming a lithographic layer from a plurality of separately printed pattern layers. Within the integrated circuit there is formed a circuit including at least two devices that are matched devices such that the performance of the circuit is degraded if the match devices deviate from having matched performance characteristics. Dummy contacts 32 (structural features) are provided within the circuit design so as to force allocation of functional contacts (structural features) of the matched devices into the same pattern layer thereby reducing inter-device variation in contact position and/or size.

12 Claims, 5 Drawing Sheets

STRUCTURAL FEATURE FORMATION WITHIN AN INTEGRATED CIRCUIT

This application is a Continuation of application Ser. No. 12/379,122, filed Feb. 12, 2009, now abandoned the entire content of which is incorporated herein by reference.

BACKGROUND OF THE INVENTION

1. Field of the Invention

This invention relates to the field of integrated circuits. More particularly, this invention relates to integrated circuit designs adapted so as to be more readily fabricated.

2. Description of the Prior Art

It is known to fabricate integrated circuits via lithographic processes whereby an integrated circuit is built up of a plurality of layers formed one on top of another. One or more of the layers typically formed includes a contact layer which provides electrical contacts to underlying layers, such as polysilicon layers or diffusion layers. It is also known to form layers including vias for providing electrical connections to underlying layers. As process geometries have decreased in size, it has become difficult to form masks capable of printing a full lithographic layer in one operation. In order to address this issue, it is known to utilise so called "double patterning" whereby two pattern layers are printed in turn and which together form a lithographic layer to be utilised for controlling a further process, such as etching, deposition etc. By splitting the formation of the lithographic layer into two or more printed pattern layers it becomes possible to space the features of the mask further apart in the different pattern layers enabling these masks to be more readily formed and printed.

It is also know within the field of integrated circuits to form circuits of multiple devices in which the performance characteristic of the circuit formed is dependent upon how well matched are the devices which combine to form that circuit. As an example, when forming sense amplifiers or operational amplifiers on an integrated circuit, it is important that various of the devices (transistors) which form those circuits have closely matching characteristics so as to avoid a degradation of the performance characteristic of the circuit as a whole, e.g. mismatched devices within an operational amplifier may produce an undesirably high offset voltage or mismatched devices within a sense amplifier may make the sense amplifier disadvantageously insensitive to one polarity of voltage difference compared to another polarity of voltage difference. This sensitivity to mismatched devices is becoming greater as process geometries fall in size since there is a general trend for increased manufacturing variance as process geometry falls in size. Such degradation in the performance characteristics of the circuits formed within an integrated circuit can be sufficient to reduce yield and/or overall performance in an unacceptable manner. This problem is also becoming worse as device geometries become smaller.

SUMMARY OF THE INVENTION

Viewed from one aspect the present invention provides an integrated circuit formed using a lithographic process including a stage of forming a lithographic layer from a plurality of separately printed pattern layers, said integrated circuit comprising: a circuit having a plurality of devices each including one or more structural features formed using said lithographic layer, at least two of said plurality of devices being matched devices such that performance of said circuit is degraded as said matched devices deviate from having matched performance characteristics; and one or more dummy structural features located relative to one or more structural features of each of said matched devices so as to force said one or more structural features of each of said matched devices to be formed in a common one of said pattern layers.

The present technique recognises that when multiple pattern layers are used to generate a lithographic layer for forming structural features, if the structural features for different matched devices are formed from different pattern layers, then there will be a disadvantageous increase in the likely mismatch between those match devices. As well as recognising this problem, the present technique provides the solution of using dummy structural features (structural features not required for the normal function of the circuit) within the design of the circuit with these dummy structural features being positioned relative to the structural features of the matched devices such that the structural features of the matched devices are forced to be formed within the same pattern layer. By forcing the structural features of matched devices to be formed within the same pattern layer, the variation between those structural features may be reduced and so the level of mismatch may be reduced.

The structural features being formed can vary. The present technique may be used in the formation of contacts and/or vias.

The manner in which the dummy structural features may serve to force the structural features of the matched device in to the same pattern layer can vary in accordance with the design rules for the fabrication process concerned. However, one frequently occurring case in which the use of dummy structural features is advantageous is when the structural features within each of the pattern layers have a minimum spacing. In this way, if a dummy structural feature is placed less than a minimum spacing away from two structural feature of match devices which or may not be formed within the same pattern layer, then the presence of the dummy structural features will force the structural feature of the devices to be in a different pattern layer to the dummy structural feature and accordingly likely in the same layer as each other.

Whilst it will be appreciated that the number of pattern layers which are formed in order to produce the lithographic layer may vary. It is often the case that there are two pattern layers which together form a lithographic layer and the present technique of the use of dummy structural features is particularly effective in the context of such double-patterning techniques.

While it will be appreciated that the circuits containing matched devices can take a variety of different forms, common forms in which the present technique is useful are integrated circuits including operational amplifiers and sense amplifiers as these circuits are sensitive to device mismatch.

The present technique is well suited to use within integrated circuits having devices with a minimum feature size of 32 nm or less as within such an environment double-patterning is often used and there is an increased sensitivity to device mismatch.

The nature of the variation between the pattern layers which can give rise to device mismatch can vary. Examples of the variation which the present technique addresses include the pattern layers having a relative placement within the lithographic layer which is subject to a degree of random placement error and the pattern layers being such that the structural features formed within each pattern layer have different degrees of size variation from their intended design size (e.g. one pattern layer may produce contacts which are smaller than the design intended and the other pattern layer may produce contacts which are larger than the design intended).

It will be appreciated that as well as having an aspect reflected in integrated circuits produced in accordance with the present techniques, another aspect of the invention is provided by a computer readable storage medium storing a design for controlling a process of fabricating an integrated circuit so as to form an integrated circuit as discussed above. The design data for forming an integrated circuit is normally distributed in the form of a computer readable storage medium to a fabrication plant, which may be located elsewhere and/or may be owned by different entity. The design features of the integrated circuit as discussed above which facilitates the fabrication of integrated circuits with reduced device mismatch is present within the design data itself and accordingly such design data forms one type of embodiment of the present invention.

Another aspect of the invention provides a method of generating data for controlling formation of a plurality of masks used to manufacture an integrated circuit using a lithographic process including a stage of forming a lithographic layer from a plurality of separately printed pattern layers formed with different masks, said integrated circuit including a circuit having a plurality of devices each including one or more structural features formed using said lithographic layer, at least two of said plurality of devices being matched devices such that performance of said circuit is degraded as said matched devices deviate from having matched performance characteristics, said method comprising the steps of: forming data defining one or more dummy structural features; allocating each contact to be formed to a pattern layer; said step of allocating being responsive to a location of said one or more dummy structural features relative to one or more structural features of each of said matched devices so as to force said one or more structural features of each of said matched devices to be formed in a common one of said pattern layers; and forming data for controlling formation of said plurality of masks used to print said plurality of pattern layers, each pattern layer including those structural features allocated to said pattern layer.

The design of an integrated circuit in accordance with the present techniques serves to provide the data for controlling formation of the masks used to manufacture an integrated circuit in a manner in which the structural features to be formed are allocated to a pattern layer in dependence upon the location of one or more dummy structural features which have been introduced into the design such that structural features of matched devices are forced in to the same pattern layers. This pattern layer data may then be used to drive the mechanisms which form the physical masks to be used during the fabrication process.

Another aspect of the invention provides a computer readable storage medium storing data defining an integrated circuit formed using a lithographic process including a stage of forming a lithographic layer from a plurality of separately printed pattern layers, said integrated circuit including a circuit having a plurality of devices each including one or more structural features formed using said lithographic layer, at least two of said plurality of devices being matched devices such that performance of said circuit is degraded as said matched devices deviate from having matched performance characteristics; said data defining said integrated circuit comprising: data defining at least one layer to be formed in said integrated circuit including one or more structural features of each of said matched devices; and data defining at least one layer including one or more dummy structural features located relative to said one or more structural features of each of said matched devices so as to force said one or more structural features of each of said matched devices to be formed in a common one of said pattern layers.

The computer readable storage medium bearing data defining an integrated circuit design may also embody the present technique by incorporating at least one layer defining structural features of the matched devices as well as at least one layer including dummy structural features located relative to the structural features of the matched devices so as to force these to be formed in a common pattern layer when that integrated circuit including the layers defined by the layer data is subject to the fabrication process flow.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
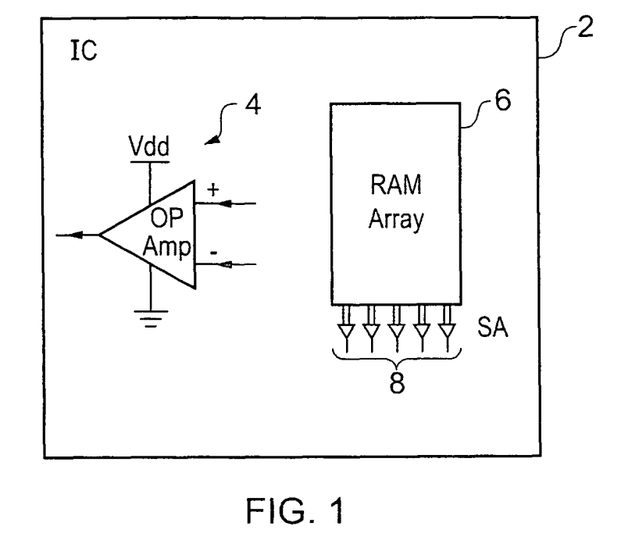
FIG. 1 schematically illustrates an integrated circuit including circuits incorporating matched devices.

FIG. 1 schematically illustrates an integrated circuit 2 including an operational amplifier circuit 4 and a memory comprising a RAM array 6 and sense amplifiers 8. It will be appreciated that an integrated circuit will typically include many further circuit components. The operational amplifier 4 and the sense amplifiers 8 are illustrated as examples of circuits within an integrated circuit which have a particular sensitivity to device mismatch within the devices which together form an operational amplifier or together form a sense amplifier. Those in this technical field will be familiar with other types of circuit which to a greater or less degree have a sensitivity to device mismatch. In general most circuits will operate better if the devices which form those circuits are closely matched in their performance characteristics.

Figure 2:
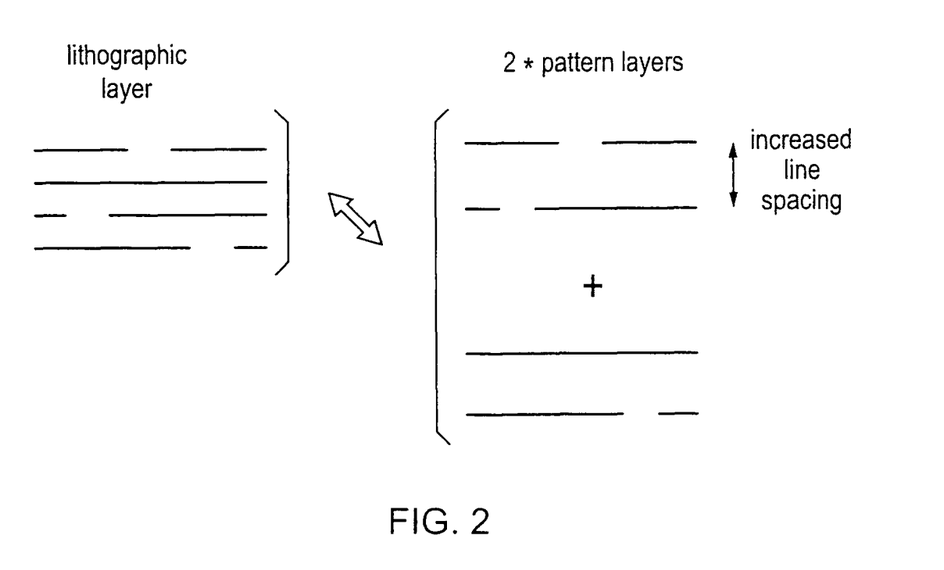
FIG. 2 schematically illustrates a lithographic layer formed as two printed pattern layers.

FIG. 2 schematically illustrates how a lithographic layer comprising multiple linear lines may be printed using two separate pattern layers which are applied in sequence and together form the overall pattern designed for the lithographic layer. As an example, if the lithographic layer comprises a layer of resist having the form shown in the left hand portion of FIG. 2, then this resist maybe printed by first using one mask which forms the upper pattern layer of the right hand side of FIG. 2 and then a second mask which forms the lower pattern layer of the right hand side of FIG. 2. The combined effect of the use of the two separate masks to form the two separate pattern layers is to produce the desired lithographic layer. It will be seen that the separate pattern layers permit a larger line spacing between the features they are seeking to define. This increased line spacing makes generation of the masks required to form each pattern layer easier as well as making the use of those masks to accurately form the required patterns easier.

Figure 3:
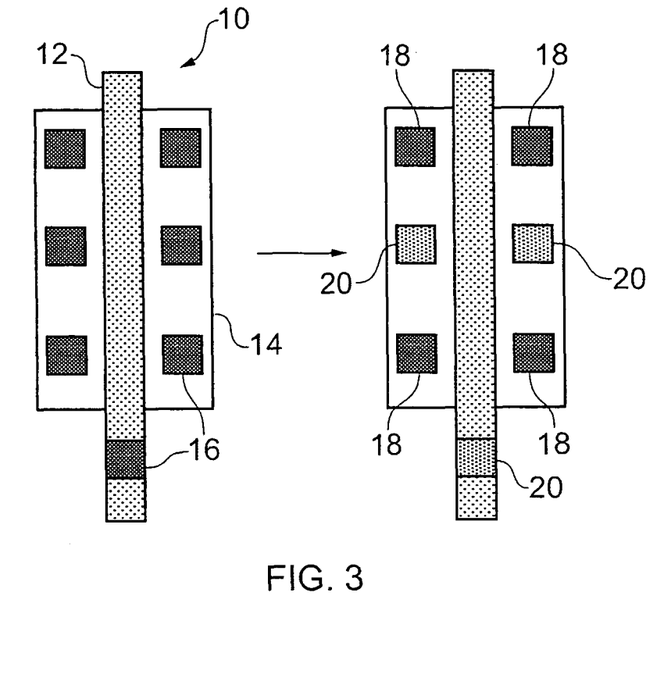
FIG. 3 schematically illustrates how contacts for a device may be allocated to different pattern layers.

FIG. 3 schematically illustrates a device 10 formed of a polysilicon layer 12 and a diffusion layer 14. Formed on the polysilicon layer 12 and the diffusion layer 14 are a plurality of contacts 16, such as metal contacts. This form of device will be familiar to those in this technical field. In other embodiments the structural features that in this example are contacts may in other examples be vias. Accordingly, references to contacts in the following will be understood to be indicating one example of a structural feature where formation may be controlled with the present techniques and other forms are also possible, e.g. the contacts 16 could be vias in other embodiments. In accordance with the double-patterning technique discussed in FIG. 2, FIG. 3 illustrates how the device 10 may be formed by using two pattern layers to form the device contacts. A first pattern layer forms the device contacts 18 and a second pattern layer forms the device contacts 20. Splitting the contacts 18, 20 so that they are formed with different, separate pattern layers permits an increased spacing within each pattern layer of the device contacts. This increased spacing within the individual pattern layers makes those pattern layers easier to form. A design rule requirement of a fabrication process may be that the device contacts within each separate pattern layer have a minimum separation. Device contacts placed too close together within the same pattern layer will be difficult to separately form without error.

Figure 4:
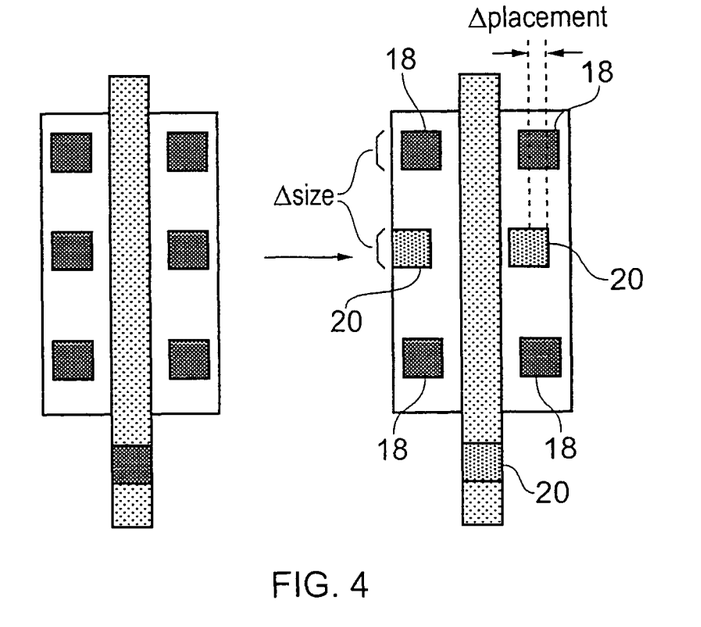
FIG. 4 schematically illustrates random variation in placement and size of contacts formed in different pattern layers.

FIG. 4 is similar to FIG. 3 except that FIG. 4 illustrates the effects of the random variation which can arise between different pattern layers. Thus, there is a placement variation between the pattern layers which results in a placement difference between the contacts of the first layer 18 and the contacts of the second layer 20 as a result of a misalignment or misplacement in the masks which were used to separately form those contacts 18, 20. In a similar way, the contacts of the first pattern layer 18 are shown to have a sized increased above their design size whereas the contacts of the second pattern layer 20 are shown to have a size decreased below their design size. This size mismatch between the two sets of contacts can result in performance variations between devices which are intended to be matched devices. The same is true of the placement variations illustrated in FIG. 4.

Figure 5:
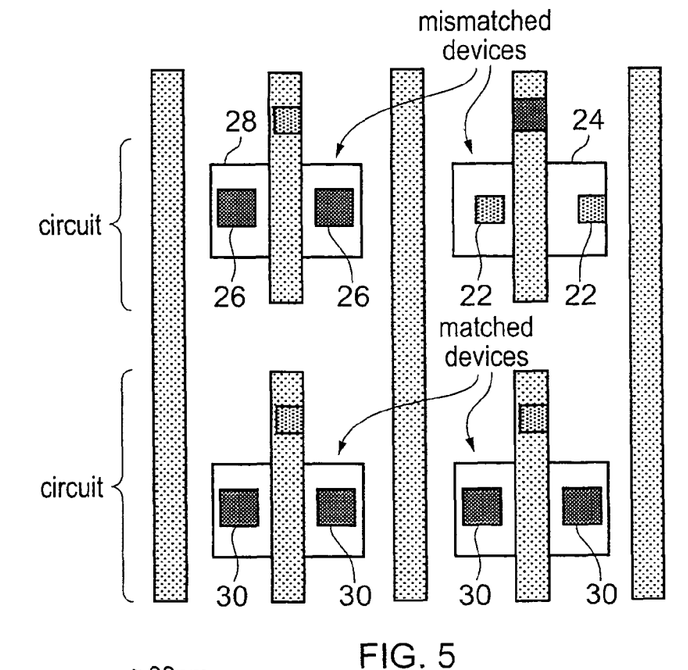
FIG. 5 illustrates how an unconstrained allocation of contacts to different pattern layers can result in mismatched devices and matched devices.

FIG. 5 schematically illustrates two circuits each including two devices formed as part of an integrated circuit. The circuits comprise two side-by-side devices intended to have matched performance characteristics. The performance of the circuit of which they form part is degraded if the matched devices do not have the same performance characteristics. In the circuits illustrated in FIG. 5, the allocation of a contact to a particular pattern layer is unconstrained. The algorithms which are conventionally responsible for allocating which contacts are to be formed as part of which pattern layer can be unpredictable and do not necessarily form the same contacts within matched devices within the same pattern layer. The upper circuit of FIG. 5 illustrates an example of this behaviour whereby the contacts 22 on the diffusion layer 24 are significantly smaller than the contacts 26 on the diffusion layer 28. The devices which include the diffusion layer 24 and the diffusion layer 28 are intended to be matched devices and the significant variation in the size of the contacts 22, 26 as a result of their formation in different pattern layers will produce mismatch devices which will degrade the overall performance of the upper circuit. In contrast to this, the lower circuit of FIG. 5 illustrates that the contacts 30 may all be formed in the same pattern layer giving rise to better matched devices within the lower circuit of FIG. 5. The unconstrained nature of the allocation of which contact is formed with which pattern layer has the result that an integrated circuit which may contain many thousands of devices that are intended to be matched will highly likely contain some mismatched devices which will degrade the performance and/or yield the integrated circuit.

Figure 6:
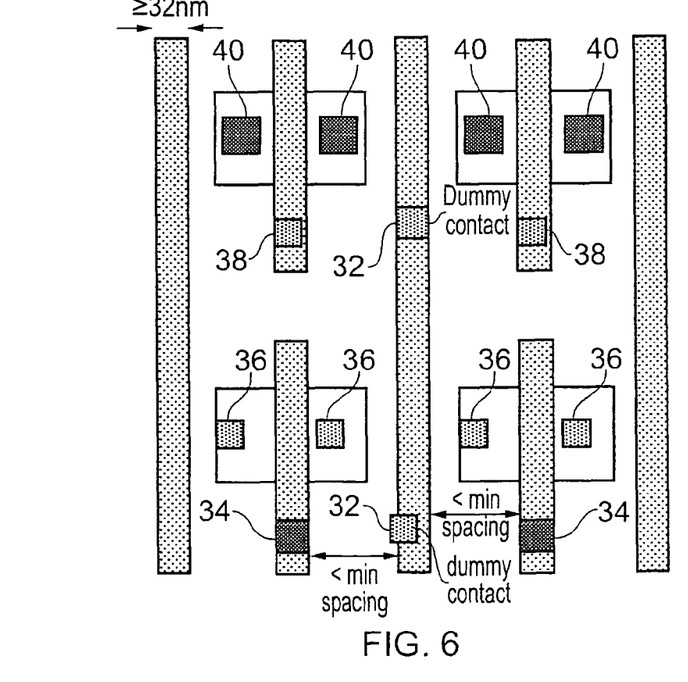
FIG. 6 schematically illustrates the use of dummy contacts to force the allocation of contacts into the same pattern layer.

FIG. 6 schematically illustrates how the circuits of FIG. 5 may be modified to include dummy contacts 32. These dummy contacts are positioned at less than a minimum spacing (double patterning rule minimum) from the contacts 34 that triggers separation in to different masks by the mask generation software. This forces the dummy contact 32 to be allocated to a pattern layer different from the pattern layer to which the contacts 34 are allocated. As there are only two pattern layers in this example, the result is that the contacts 34 are allocated to the same pattern layer. Thus, variations in size or position associated with the pattern layer common to (shared by) the two contacts 34 will equally effect those two contacts. A further effect of forcing the two contacts 34 into the same pattern layer is that the contacts 36 which are formed over the diffusion layer and have less than the required minimum spacing from the contacts 34 will similarly be forced into a different pattern layer to that of the contact 34. Again, this forced constraint into a different pattern layer has the result of forcing the contacts 36 into the same pattern layer as each other thereby reducing positional and size variation between the contacts 36.

It will be seen that the dummy contact 32 in the upper portion of FIG. 6 has the same effect of forcing the contacts 38 into the same pattern layer. By virtue of the required minimum spacing design rule between contacts 38 and 40, the contacts 40 are all placed into a different pattern layer to the contacts 38 and in the same pattern layer to each other. It will be seen that the upper and lower circuits of FIG. 6 have allocated the contacts to different pattern layers, but have nevertheless maintained a balance between the devices which are intended to be matched.

Also illustrated in FIG. 6 is the device geometry size of the layout being formed. In this example the minimum feature size is 32 nm. This corresponds to a 32 nm process geometry. The present techniques are well suited to geometries of this size and smaller where the requirement to use double patterning is strong and the sensitivity to device mismatches is high.

Figure 7:
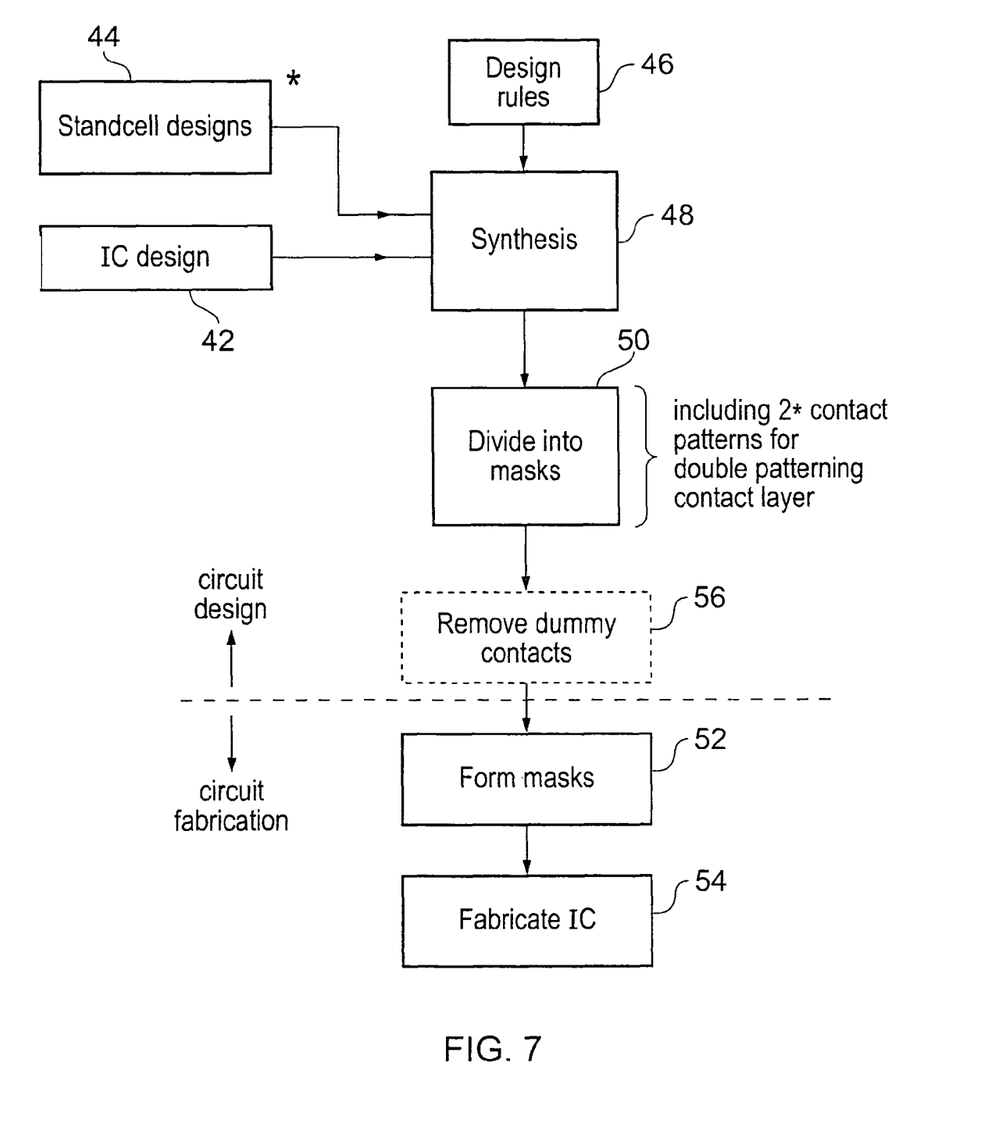
FIG. 7 schematically illustrates a process flow for design and fabrication of an integrated circuit.

FIG. 7 schematically illustrates a process flow in producing an integrated circuit. An integrated circuit design, such as the design of a microprocessor, is represented by block 42. In practice this integrated circuit design may be embodied as a computer readable storage medium containing data defining that integrated circuit design. Also providing an input to the production process is a library of standard cell designs 44 which form the building blocks from which the integrated circuit design 42 may be turned into a layout of an integrated circuit for fabrication. These standard cell designs 44 typically comprise circuits such as logic gates, sense amplifiers, operational amplifiers, latches, RAM cells and the like which together may be assembled to form a desired integrated circuit design 42 that is specified higher more functional level. The standard cell designs 44 specify the different lithographic layers from which the standard cell is formed and features such as the relative positions and size of contacts, diffusion regions, polysilicon layers etc. The dummy contacts of the present technique will typically be provided within the standard cell designs 44. As an example, the standard cells including the matched devices illustrated in FIG. 6 will have added to them the dummy contacts 32. When these standard cell designs are further processed, as will be discussed below, the presence of the dummy contacts 32 will constrain the allocation of the other contacts into the different pattern layers. This will force contacts for matched devices into the same pattern layer thereby reducing the mismatch between those matched devices.

It will be appreciated that the present techniques are not limited to standard cell designs and may, for example, as .be used in full custom layout designs and/or in connection with place and route algorithms that provide interconnections between standard cells.

Another input to the process are the design rules 46. These design rules specify factors such as minimum contact spacing which must be observed when the design defined by the integrated circuit design 42 and the standard cell designs 44 is assembled as shown in the synthesis block 48. These processes of utilising an integrated circuit design 42, standard cell designs 44 and design rules 46 will be familiar to those in this technical field. The synthesis process 48 is typically performed by a computer program and accordingly the inputs comprising the integrated circuit design 42, the standard cell designs 44 and the design rules 46 would normally be in the form of computer readable storage media (e.g. data stored within memory, on physical media such as CDs, etc).

Subsequent to the synthesis indicated by block 48, there will be a process which divides the lithographic layer for forming the contacts into two pattern layers for forming the contact lithographic layer (an integrated circuit may have more than one contact lithographic layer). These two pattern layers correspond to respective masks which will be generated for use within the fabrication process. At the stage illustrated in block 50, the division into different masks is at the level of dividing the data defining which contacts are to be formed such that different contacts are allocated to different pattern layers (masks). Once all the contact data has been allocated it may be used to generate a data stream which then goes on to form a mask at the step illustrated in block 52. The masks so formed at block 52 are used in the fabrication facility illustrated at block 54 to fabricate the physical integrated circuits.

A variation in the present technique is to include dummy contacts within the standard cell designs 44, but include these as a separate layer within the design (e.g. marked with metadata as belonging to a separate layer from the other contacts required for the functioning circuit). The dummy contacts provided in this way may be subject to the design rules 46 and accordingly constrain the allocation of the other, functional contacts into appropriate respective pattern layers. However, once the dummy contacts have performed this task of constraining the allocation of the "real" contacts, then the dummy contact data can be filtered from the other data defining the "real" contacts (e.g. using the metadata referred to above) and not passed on to the process which forms the physical masks as illustrated in block 52. This optional removal of the dummy contacts is illustrated by block 56 in FIG. 7. In this way, the circuit fabrication illustrated in blocks 52 and 54 can be unaltered in that it simply takes data defining which masks are to be formed and forms these at block 52 and then uses these masks at block 54 to fabricate the physical integrated circuits.

When the dummy contacts are removed at block 56, such that they will not actually physically be formed on the integrated circuits which are ultimately produced, it is possible to relax the design rules 46 in respect of those dummy contacts. Thus, for example, since the dummy contacts will not actually be physically formed it may be possible to relax their placement rules. Relaxing these rules in relation to the dummy contacts can have the advantage of giving more flexibility in where they are located, which in turn may facilitate them in their role of constraining to which pattern layers the remaining contacts which will actually be fabricated are allocated.

Figure 8:
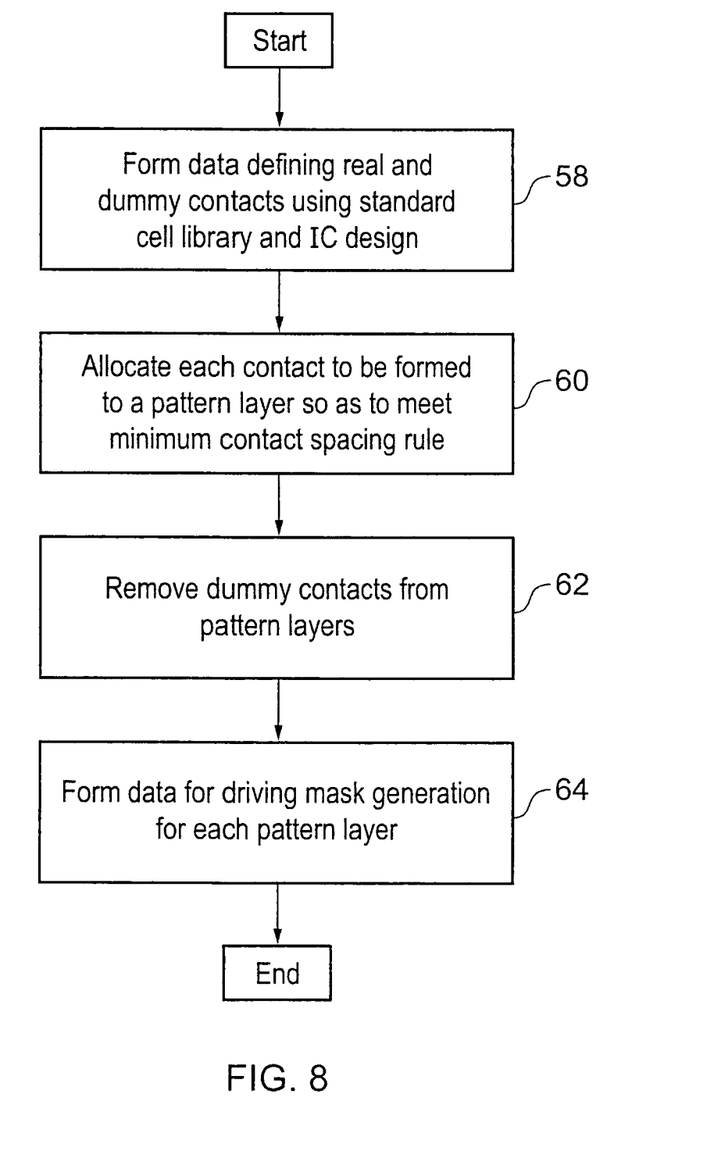
FIG. 8 is a flow diagram schematically illustrating a process for forming data for driving mask generation.

FIG. 8 is a flow diagram schematically illustrating another view of the present technique. At step 58 the data defining the real and dummy contacts is formed using a standard cell library and an integrated circuit design. In this way, the form of the lithographic layer for producing the desired contacts may be defined. This data will typically be computer readable data being used to drive a computer program controlling the fabrication process.

At step 60, the data defining the contacts within the lithographic layer is processed such that each contact to be formed is allocated to a pattern layer within the two pattern layers of a double-patterning process so as to meet the minimum contact spacing rule. The positioning of the dummy contacts within the data defined at step 58 is such to force the allocation of contacts for matching devices into the same pattern layer thereby reducing the inter-device variance in performance characteristics.

At step 62 the dummy contacts are removed from the pattern layers. Step 62 is optional. It may be acceptable for the dummy contacts to actually be fabricated in the physical integrated circuit. However, in some circumstances the dummy contacts may introduce undesirable effects, such as increased capacitance.

At step 64 the separate pattern layers to which the contacts have been allocated are used to form data for driving a mask generation process of each pattern layer. This data can then be passed to a circuit fabrication facility so that the physical masks can be formed and then used to form the physical integrated circuits.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. In a lithographic process, a method of forming a plurality of masks used to manufacture an integrated circuit including a stage of forming a lithographic layer from a plurality of separately printed pattern layers formed with different masks, said integrated circuit including a circuit having a plurality of devices each including one or more structural features formed using said lithographic layer, at least two of said plurality of devices being matched devices such that performance of said circuit is degraded as said matched devices deviate from having matched performance characteristics, said method comprising the steps of:

forming data defining one or more dummy structural features;

allocating each contact to be formed to a pattern layer; said step of allocating being responsive to a location of said one or more dummy structural features relative to one or more structural features of each of said matched devices so as to force said one or more structural features of each of said matched devices to be formed in a common one of said pattern layers;

forming data for controlling formation of said plurality of masks used to print said plurality of pattern layers, each pattern layer including those structural features allocated to said pattern layer; and forming said plurality of masks using said data for controlling formation.

2. A method as claimed in claim 1, wherein said one or more structural features are one or more contacts and said one or more dummy structural features are one or more dummy contacts.

3. A method as claimed in claim 1, wherein said one or more structural features are one or more vias and said one or more dummy structural features are one or more dummy vias.

4. A method as claimed in claim 1, wherein, after said step of allocating each structural feature to be formed to a pattern layer, removing said data defining said one or more dummy structural features such that said plurality of masks do not form said one or more dummy structural features.

5. A method as claimed in claim 1, wherein structural features within each of said pattern layers have a minimum spacing.

6. A method as claimed in claim 5, wherein said one or more dummy structural features has less than said minimum spacing from said one or more structural features of each of said matched devices so as to force said one or more structural features of each of said matched devices to be formed in a different one of said pattern layers from said one or more dummy structural features.

7. A method as claimed in claim 1, wherein said plurality of separately printed pattern layers comprises two separately printed pattern layers.

8. A method as claimed in claim 1, wherein said circuit comprises one of:
   a sense amplifier circuit; and
   an operational amplifier circuit.

9. A method as claimed in claim 1, wherein said devices have a minimum feature size of 32 nm or less.

10. A method as claimed in claim 1, wherein said plurality of pattern layers have a relative placement within said lithographic layer subject to a degree of random placement error.

11. A method as claimed in claim 1, wherein said contacts each have a design size and structural features formed in different pattern layers have different degrees of size variation from their design size.

12. A non-transitory computer readable storage medium storing data defining an integrated circuit formed by a lithographic process including a stage of forming a lithographic layer from a plurality of separately printed pattern layers, said integrated circuit including a circuit having a plurality of devices each including one or more structural features formed using said lithographic layer, at least two of said plurality of devices being matched devices such that performance of said circuit is degraded as said matched devices deviate from having matched performance characteristics; said data defining said integrated circuit comprising:
   data defining at least one layer to be formed in said integrated circuit including one or more structural features of each of said matched devices; and
   data defining at least one layer including one or more dummy structural features located relative to said one or more structural features of each of said matched devices so as to force said one or more structural features of each of said matched devices to be formed in a common one of said pattern layers.

* * * * *